(12) United States Patent
Park

(10) Patent No.: US 8,383,018 B2
(45) Date of Patent: Feb. 26, 2013

(54) METHOD OF FORMING NANOCOMPOSITE SOLUTION, AND NANOCOMPOSITE PHOTOVOLTAIC DEVICE

(75) Inventor: Jonghyurk Park, Daegu (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 334 days.

(21) Appl. No.: 12/860,568

(22) Filed: Aug. 20, 2010

(65) Prior Publication Data

US 2011/0220186 A1 Sep. 15, 2011

(30) Foreign Application Priority Data

Mar. 9, 2010 (KR) .................. 10-2010-0020911

(51) Int. Cl.
*H01B 1/02* (2006.01)
*H01L 31/00* (2006.01)

(52) U.S. Cl. .............. 252/518.1; 29/623.5; 136/252; 252/519.3; 252/519.5; 252/520.1; 252/520.2; 977/773; 977/811

(58) Field of Classification Search ............... 29/623.5; 136/252; 252/518.1, 519.3, 519.5, 520.1, 252/520.2; 977/773, 811
See application file for complete search history.

(56) References Cited

U.S. PATENT DOCUMENTS

| 6,225,198 | B1 | 5/2001 | Alivisatos et al. | |
| 7,259,100 | B2 * | 8/2007 | Zurcher et al. | 438/700 |
| 7,603,003 | B2 | 10/2009 | Bureatea et al. | |
| 2008/0138270 | A1 * | 6/2008 | Li et al. | 423/349 |
| 2008/0209876 | A1 * | 9/2008 | Miller | 55/522 |

FOREIGN PATENT DOCUMENTS

| CN | 101407334 A | * | 4/2009 |
| JP | 2006-104255 A | | 4/2006 |
| KR | 10-0297009 | | 9/2001 |

OTHER PUBLICATIONS

Xuegeng Li, Yuanqing He, and Mark T. Swihart, Surface Functionalization of Silicon Nanoparticles Produced by Laser-Driven Pyrolysis of Silane followed by HF-HNO3 Etching, Langmuir 2004, 20, 4720-4727, © 2004 American Chemical Society.*

Fei Li et al., "Sonochemical synthesis and characterization of ZnO nanorod/Ag nanoparticle composites", Cryst. Res. Technol. vol. 44, No. 11, pp. 1249-1254 (2009).

H. Y Lin et al., "Giant enhancement of band edge emission based on ZnO/TiO2 nanocomposites" Optics Express, vol. 15, No. 21, Oct. 17, 2007, pp. 13832-13837.

Yu Zhang, et al., "Surface photovoltage characterizationc of a ZnO nanowire array/CdS quantum dot heterogeneous film and its application for photovoltaic devices", Nanotechnolgy, 20, pp. 155707-155712 (2009).

* cited by examiner

*Primary Examiner* — Bijan Ahvazi
(74) *Attorney, Agent, or Firm* — H.C. Park & Associates, PLC

(57) ABSTRACT

Provided is a method of forming a nanocomposite solution, and a nanocomposite photovoltaic device. In the method, a metal oxide nanorod solution is prepared and a nanoparticle solution is prepared. The metal oxide nanorod solution and the nanoparticle solution are mixed to form a nanocomposite solution.

11 Claims, 6 Drawing Sheets

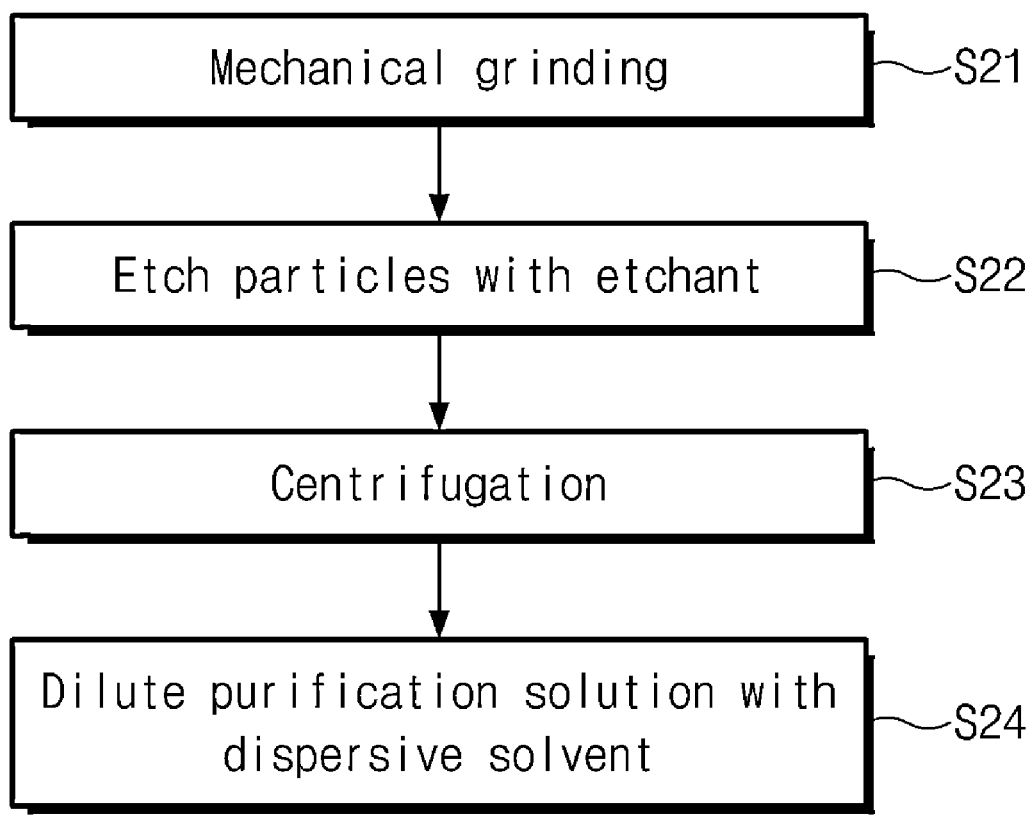

METHOD OF FORMING NANOCOMPOSITE SOLUTION, AND NANOCOMPOSITE PHOTOVOLTAIC DEVICE

CROSS-REFERENCE TO RELATED APPLICATIONS

This U.S. non-provisional patent application claims priority under 35 U.S.C. §119 of Korean Patent Application No. 10-2010-0020911, filed on Mar. 9, 2010, the entire contents of which are hereby incorporated by reference.

BACKGROUND OF THE INVENTION

The present invention disclosed herein relates to a method of forming a nanocomposite solution, and a nanocomposite photovoltaic device, and more particularly, to a method of forming a nanocomposite solution including a nanorod and nanoparticle, and a nanocomposite photovoltaic device.

Typically, quantum dot devices or nanoparticles may be grown in situ into a thin film shape, or may be formed into the shape of a composite with an organic material after being grown in a solution state. The quantum dot devices or the nanoparticles are widely used in conductors, dielectrics, diodes, transistors, solar cells, and secondary cells. If quantum dot devices or nanoparticles are formed of an inorganic composite, a mixed thin film may be formed by co-sputtering, evaporation, molecular beam evaporation (MBE) or chemical vapor deposition (CVD). In this case, it requires special conditions of vacuum or high-temperature states, there are many process limitations and the growth condition control of a nanostructure may be difficult. If quantum dot devices or nanoparticles have the shape of a composite with an organic material, an organic material or an inorganic material with the semiconductor/metal/dielectric characteristics of a grown nanostructure may be mixed in a solution state or an organic material may be deposited on an inorganic material deposited on a substrate. Typically, if an organic material and an inorganic material are dispersed on a solution under the same condition, the physical and chemical states of a surface may be different, thus making it very difficult to obtain a uniform solution. Also, if an organic material and an inorganic material are deposited separately, a nanostructure may be formed densely, thus making it difficult to uniformly fill it with additionally-deposited components.

SUMMARY OF THE INVENTION

The present invention provides a method of forming a nanocomposite solution capable of various applications, and a nanocomposite photovoltaic device.

In some embodiments of the present invention, methods of forming a nanocomposite solution may include: preparing a metal oxide nanorod solution; preparing a nanoparticle solution; and mixing the metal oxide nanorod solution and the nanoparticle solution to form a nanocomposite solution.

In some embodiments, the preparing of the metal oxide nanorod solution may include: preparing a metal oxide precursor solution; preparing an alcohol-based solution including a basic chemical species; and mixing/reacting the metal oxide precursor solution and the alcohol-based solution to form a metal oxide nanorod.

In other embodiments, the forming of the metal oxide nanorod further may include applying an ultrasonic wave or an electromagnetic wave after mixing the metal oxide precursor solution and the alcohol-based solution.

In further embodiments, the metal oxide precursor solution may include zinc acetate ($Zn(C_2H_3O_2)_2$).

In still further embodiments, the alcohol-based solution may be prepared by reacting potassium hydroxide (KOH) and methanol ($CH_3OH$).

In still further embodiments, the metal oxide nanorod may include a zinc oxide nanorod.

In still further embodiments, the metal oxide nanorod may include tin oxide ($SnO_2$), indium oxide ($In_2O_3$), or titanium oxide ($TiO_2$).

In still further embodiments, the metal oxide nanorod has a length of about 50 nm to about 200 nm.

In still further embodiments, the preparing of the nanoparticle solution may include: mechanically grinding a target material to form primary particles; etching the primary particles with an etchant to form an intermediate solution including secondary particles; removing a supernatant from the intermediate solution through a centrifugation process to form a purification solution; and diluting the purification solution with a dispersive solvent.

In still further embodiments, the etchant may include nitric acid, fluoric acid, and water.

In still further embodiments, the nitric acid, the fluoric acid and the water may have a mass ratio of about 50:5:50.

In still further embodiments, the dispersive solvent may include isopropyl alcohol (IPA) or methanol.

In still further embodiments, the target material may include silicon.

In still further embodiments, the target material may include aurum, argentum, gallium arsenide, indium arsenide, cadmium selenide, or zinc selenide.

In other embodiments of the present invention, composite photovoltaic devices may include: a second electrode spaced apart from a first electrode; and a nanocomposite thin film disposed between the first electrode and the second electrode and having a photoelectric effect, wherein the nanocomposite thin film includes a mixture of nanorods and nanoparticles.

In some embodiments, the nanorods may include zinc oxide, tin oxide ($SnO_2$), indium oxide ($In_2O_3$), or titanium oxide ($TiO_2$).

In other embodiments, the nanoparticles may include aurum, argentum, gallium arsenide, indium arsenide, cadmium selenide, or zinc selenide.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 3 is a flow diagram illustrating a method of forming a nanoparticle solution according to an exemplary embodiment of the present invention;

DETAILED DESCRIPTION OF PREFERRED EMBODIMENTS

Figure 1:
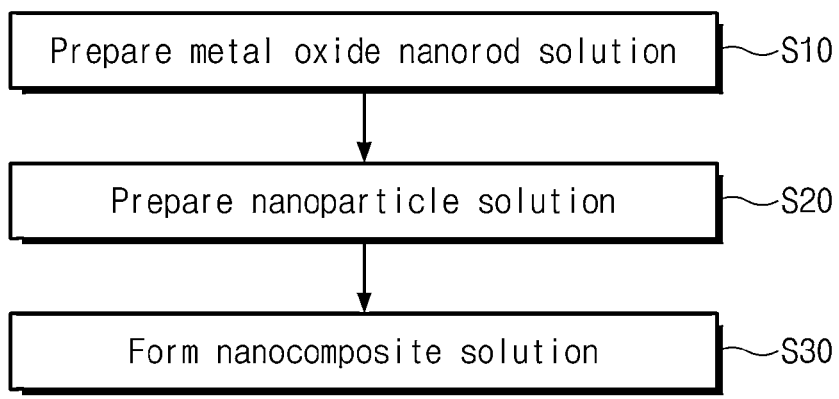
FIG. 1 is a flow diagram illustrating a method of forming a nanocomposite solution according to an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that when an element is referred to as being "on" another element, it can be directly on the other element or intervening elements may also be present. In the drawings, the dimensions of elements are exaggerated for clarity of illustration. Like reference numerals refer to like elements throughout.

The embodiment in the detailed description will be described with sectional views as ideal exemplary views of the present invention. In the drawings, the dimensions of layers and regions are exaggerated for clarity of illustration. Accordingly, shapes of the exemplary views may be modified according to forming techniques and/or allowable errors. Therefore, the embodiments of the present invention are not limited to the specific shape illustrated in the exemplary views, but may include other shapes that may be created according to forming processes. For example, an etched region illustrated as a rectangle may have rounded or curved features. Areas exemplified in the drawings have general properties, and are used to illustrate a specific shape of a semiconductor package region. Thus, this should not be construed as limiting to the scope of the present invention. Although terms like a first, a second, and a third are used to describe various elements in various embodiments of the present invention, the elements are not limited by these terms. These terms are used only to discriminate an element from another element. An embodiment described and exemplified herein includes a complementary embodiment thereof.

In the following description, the technical terms are used to describe exemplary embodiments without limiting the present invention. The terms of a singular form may include plural forms unless otherwise mentioned. The meaning of "include," "comprise," "including," or "comprising," specifies an element but does not exclude other elements.

FIG. 1 is a flow diagram illustrating a method of forming a nanocomposite solution according to an exemplary embodiment of the present invention.

Referring to FIG. 1, a metal oxide nanorod solution is prepared (S10). Thereafter, a nanoparticle solution is prepared (S20). Thereafter, the metal oxide nanorod solution and the nanoparticle solution are mixed to form a nanocomposite solution (S30). The nanocomposite solution may include nanorods and nanoparticles. The metal oxide nanorod may include zinc oxide. Alternatively, the metal oxide nanorod may include tin oxide ($SnO_2$), indium oxide ($In_2O_3$), or titanium oxide ($TiO_2$). The metal oxide nanorod may have a length of about 50 nm to about 200 nm. The nanoparticle may include silicon (Si). Alternatively, the nanoparticle may include aurum, argentum, gallium arsenide (GaAs), indium arsenide (InAs), cadmium selenide (CdSe), or zinc selenide (ZnSe). For example, the nanocomposite may include zinc oxide nanorods and silicon nanoparticles. The size of the nanoparticle may be substantially equal to or smaller than the size of the metal oxide nanorod. That is, the nanoparticle may have a diameter of less than 200 nm.

The energy band gap or the absorption wavelength of the nanoparticle of the nanocomposite may be controlled according to a size of the nanoparticle. Accordingly, the optical characteristics of the nanoparticle of the nanocomposite may be improved using the surface-enhanced Raman scattering (SERS) effect.

The nanorod of the nanocomposite may have a high electrical conductivity due to a one-dimensional structure with directionality. Consequently, the optical characteristics of the nanoparticle and the electrical characteristics of the nanorod of the nanocomposite may be used for a thin film of a photovoltaic device. For example, though the zinc oxide nanorod is transparent in the visible ray region with an energy band gap of 3.4 eV, the photoreaction characteristics of the zinc oxide nanorod in the visible ray band may be improved by using a low energy band gap of the silicon nanoparticle.

Figure 2:
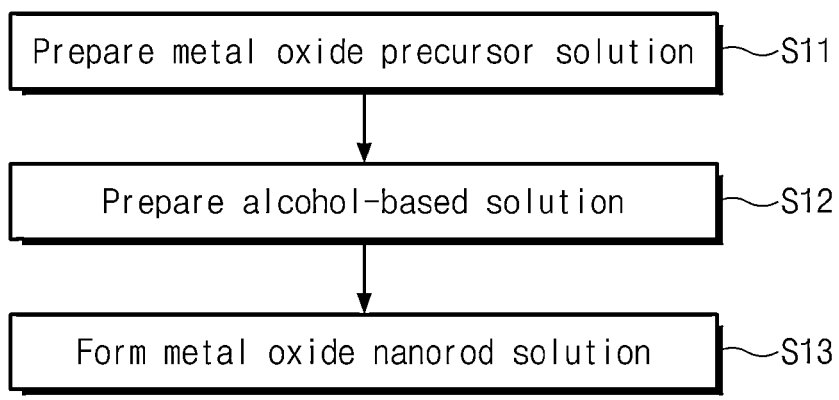
FIG. 2 is a flow diagram illustrating a method of forming a nanorod solution according to an exemplary embodiment of the present invention.

FIG. 2 is a flow diagram illustrating a method of forming a nanorod solution according to an exemplary embodiment of the present invention.

Referring to FIG. 2, the preparing of the metal oxide nanorod solution (S10) may include: preparing a metal oxide precursor solution (S11); preparing an alcohol-based solution including a basic chemical species (S12); and mixing/reacting the metal oxide precursor solution and the alcohol-based solution to form a metal oxide nanorod (S13).

The preparing of the metal oxide nanorod solution (S10) may include mixing a metal oxide precursor and a solvent. The metal oxide precursor may include metal acetate, metal alkoxide, metal halide, a hydrate thereof, or a combination thereof. The solvent may include alcohol. The alcohol may include methanol, ethanol, n-propanol, isopropanol, or a mixture thereof.

For example, the preparing of the metal oxide nanorod solution (S10) may include melting zinc acetate (Zn($C_2H_3O_2$)$_2$) in methanol ($CH_3OH$).

The alcohol-based solution may be prepared by reacting a basic chemical species and alcohol (S12). The basic chemical species may include lithium hydroxide (LiOH), sodium hydroxide (NaOH), potassium hydroxide (KOH), ammonium hydroxide ($NH_4OH$), a hydrate thereof, or a combination thereof. The alcohol may include methanol, ethanol, n-propanol, isopropanol, or a mixture thereof. For example, the preparing of the alcohol-based solution may include melting the potassium hydroxide (KOH) in the methanol.

The preparing of the alcohol-based solution may further include mixing water ($H_2O$) and organic solvent into a reaction product of the basic chemical species and the alcohol. For example, the organic solvent may include acetone, methyl ethyl ketone, tetrahydrofuran, benzene, toluene, o-xylene, m-xylene, p-xylene, methylene, di ethyl ether, dichloromethane, chloroform, or a mixture thereof.

The forming of the metal oxide nanorod (S13) may include applying an ultrasonic wave or an electromagnetic wave (e.g., microwave, infrared ray, visible ray, and ultraviolet ray) after mixing the metal oxide precursor solution and the alcohol-based solution.

The applying of the ultrasonic waves may be performed using an ultrasonic reactor. For example, a mixture liquid may react by using an ultrasonic wave with a frequency of about 20

KHz to about 70 KHz, and the mixture liquid may be that the metal oxide precursor solution mixes with the alcohol-based solution including the basic chemical species. The ultrasonic used to react the mixture liquid may be a pulse type or a continuous type. Herein, the ultrasonic wave reaction time of the mixture liquid may be adjusted to about 1 hour to about 24 hours.

The temperature of the reactor for reacting the mixture liquid may be maintained to be constant during the reacting of the mixture liquid. To this end, the reactor may be provided with a cooling device for maintaining the temperature of the mixture liquid to be constant.

The reaction product of the metal oxide precursor solution and the alcohol-based solution may be centrifuged to remove the solvent and other by-products from the reaction product. The centrifuged reaction product may be dispersed in methanol and then it may be again centrifuged to again remove the solvent and other by-products from the reaction product. The centrifugation operation may be performed two or more times. Accordingly, a purified metal oxide nanorod solution (e.g., a zinc oxide nanorod) may be formed. Herein, the size of the zinc oxide nanorod may be adjusted according to the reaction temperature and the reaction time.

The nanocomposite solution may be formed into a nanocomposite thin film by a spin coating process, an ink-jetting process or a spray process. According to an exemplary embodiment of the present invention, a nanocomposite solution with a mixture of nanorods and nanoparticles can be easily formed. A large-area process may be possible by using the nanocomposite solution. Also, the nanocomposite solution may be used in the filed of a glass or plastic substrate requiring a low-temperature process.

FIG. 3 is a flow diagram illustrating a method of forming a nanoparticle solution according to an exemplary embodiment of the present invention.

Referring to FIG. 3, the preparing of the nanoparticle solution (S20) may include: mechanically grinding a target material to form primary particles (S21); etching the primary particles with an etchant to form an intermediate solution including secondary particles (S22); removing a supernatant from the intermediate solution through a centrifugation process to form a purification solution (S23); and diluting the purification solution with a dispersive solvent (S24). The mechanical grinding process may be performed for about 10 hours. The etchant may include nitric acid ($HNO_3$), fluoric acid (HF), and water ($H_2O$). The nitric acid, the fluoric acid and the water may have a mass ratio of about 50:5:50. The centrifugation process may be performed at about 3500 rpm for about 30 minutes. The centrifugation process may be performed additionally after the decanting of the supernatant. The dispersive solvent may include isopropyl alcohol (IPA) or methanol. The target material may be silicon. Alternatively, the target material may include aurum, argentum, gallium arsenide, indium arsenide, cadmium selenide, or zinc selenide.

Figure 4A:
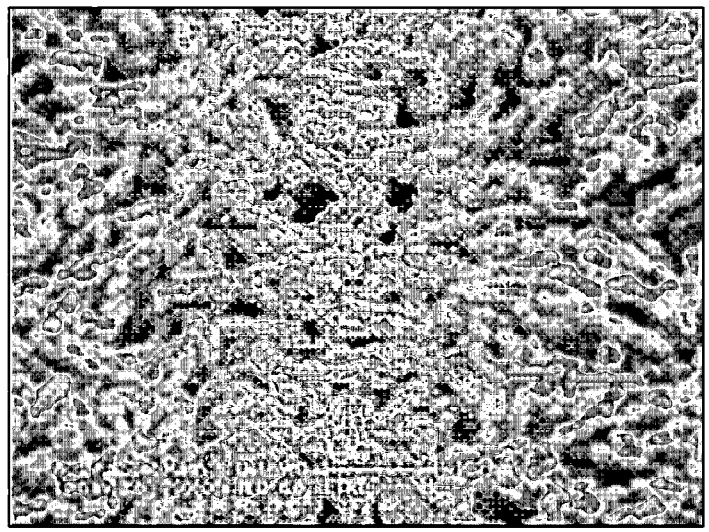
FIGS. 4A to 4D are diagrams illustrating the images and the composition analysis results of a nanocomposite thin film formed according to an exemplary embodiment of the present invention.
Figure 4B:
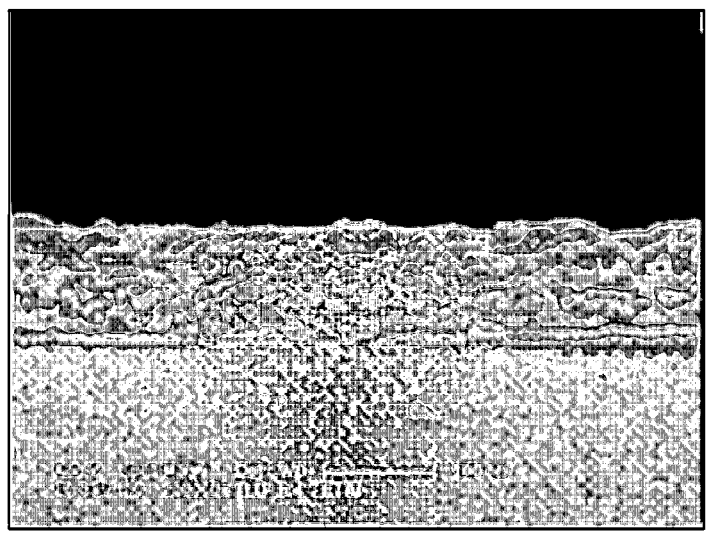
Figure 4C:
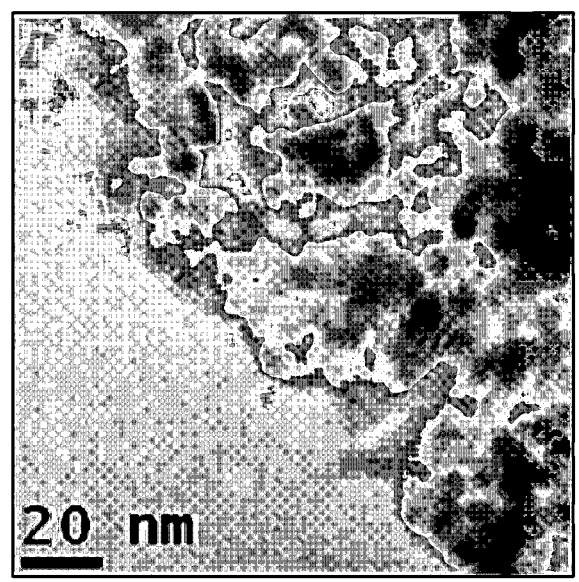
Figure 4D:
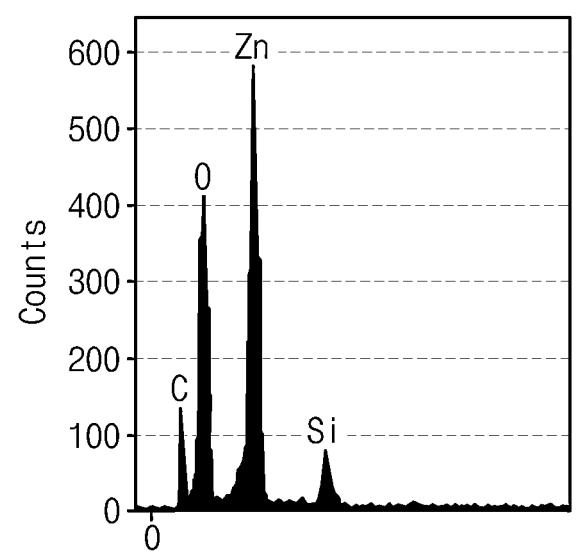

FIGS. 4A to 4D are diagrams illustrating the images and the composition analysis results of a nanocomposite thin film formed according to an exemplary embodiment of the present invention. FIGS. 4A to 4D are diagrams illustrating a nanocomposite thin film formed using a nanocomposite solution including a zinc oxide nanorod and a silicon nanoparticle. FIG. 4A is a planar scanning electron microscope (SEM) image of the nanocomposite thin film formed using a nanocomposite solution. FIG. 4B is a sectional SEM image of the nanocomposite thin film formed using a nanocomposite solution. FIG. 4C is a transmission electron microscope (TEM) image of the nanocomposite thin film formed using a nanocomposite solution. FIG. 4D is a graph analyzing the composition of the nanocomposite thin film formed using a nanocomposite solution. FIG. 4D analyzes elements by energy dispersive spectroscopy (EDS). In FIG. 4D, the horizontal axis represents elements (atomic weight) and the vertical axis represents constituent weight (counts).

Figure 5:
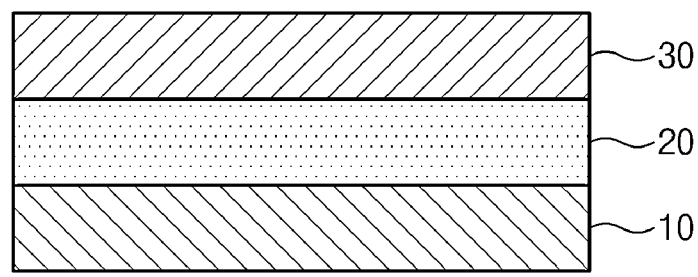
FIG. 5 is a schematic diagram illustrating a nanocomposite photovoltaic device according to an exemplary embodiment of the present invention.

FIG. 5 is a schematic diagram illustrating a nanocomposite photovoltaic device according to an exemplary embodiment of the present invention. A nanocomposite photovoltaic device according to an exemplary embodiment of the present invention may be used in various devices such as a photodiode, a light-emitting diode, and a solar cell. For example, a photovoltaic device such as a two-terminal solar cell is exemplified to describe the present invention.

Referring to FIG. 5, a nanocomposite thin film 20 with a photoelectric effect is disposed on a first electrode 10. A second electrode 30 is disposed on the nanocomposite thin film 20. The nanocomposite thin film 20 may include a mixture of nanorod and nanoparticle. The nanorod may include zinc oxide, tin oxide ($SnO_2$), indium oxide ($In_2O_3$), or titanium oxide ($TiO_2$). The nanoparticle may include aurum, argentum, gallium arsenide, indium arsenide, cadmium selenide, or zinc selenide. For example, the nanocomposite thin film 20 may include a zinc oxide nanorod and a silicon nanoparticle. The nanocomposite thin film 20 may include 5 wt % silicon or 10 wt % silicon. The nanorod may have good electrical characteristics by a one-dimensional structure, and the nanoparticle may have good optical characteristics. The charge generated from the nanoparticle by the photoelectric effect may be transferred through the nanorod to the first electrode 10 and the second electrode 30.

The nanocomposite thin film 20 may be formed using the nanocomposite solution described above. Specifically, the nanocomposite thin film 20 may be formed through a spin-coating process, an ink-jetting process or a screen-printing process by using the nanocomposite solution. Thus, the nanocomposite thin film 20 can be formed through a relatively simple process, and a large-area process may be possible. Also, it may be used in the filed of a glass or plastic substrate requiring a low-temperature process.

Figure 6:
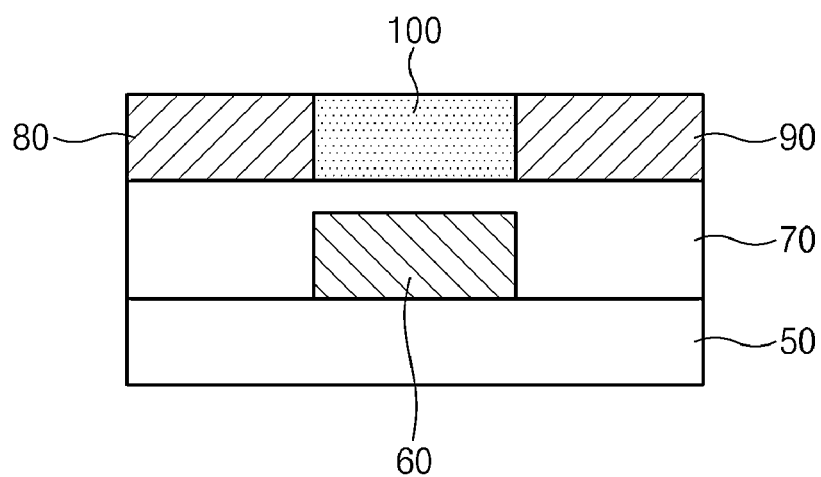
FIG. 6 is a schematic diagram illustrating a nanocomposite transistor according to an exemplary embodiment of the present invention.

FIG. 6 is a schematic diagram illustrating a nanocomposite transistor according to an exemplary embodiment of the present invention. FIG. 6 illustrates a device with a three-terminal structure.

Referring to FIG. 6, a gate electrode 60 is disposed on a substrate 50. The gate electrode 60 may include a conductive material. A dielectric layer 70 is disposed on the substrate 50 to cover the gate electrode 60. A source electrode 80 and a drain electrode 90 are disposed on the dielectric layer 70 such that the source electrode 80 and the drain electrode 90 are spaced apart from each other. A nanocomposite thin film 100 is disposed between the source electrode 80 and the drain electrode 90 on the dielectric layer 70.

The nanocomposite thin film 100 may include a mixture of nanorod and nanoparticle. The nanorod may include zinc oxide, tin oxide ($SnO_2$), indium oxide ($In_2O_3$), or titanium oxide ($TiO_2$). The nanoparticle may include aurum, argentum, gallium arsenide, indium arsenide, cadmium selenide, or zinc selenide. For example, the nanocomposite thin film 100 may include a zinc oxide nanorod and a silicon nanoparticle. The nanocomposite thin film 100 may include 5 wt % silicon or 10 wt % silicon. The nanorod may have good electrical characteristics by a one-dimensional structure, and the nanoparticle may have good optical characteristics.

The nanocomposite thin film 100 may serve as a channel of the transistor. In the nanocomposite thin film 100, electron-hole pairs may be generated by the photoelectric effect to change the threshold voltage of the transistor or the current between the source electrode 80 and the drain electrode 90.

Figure 7:
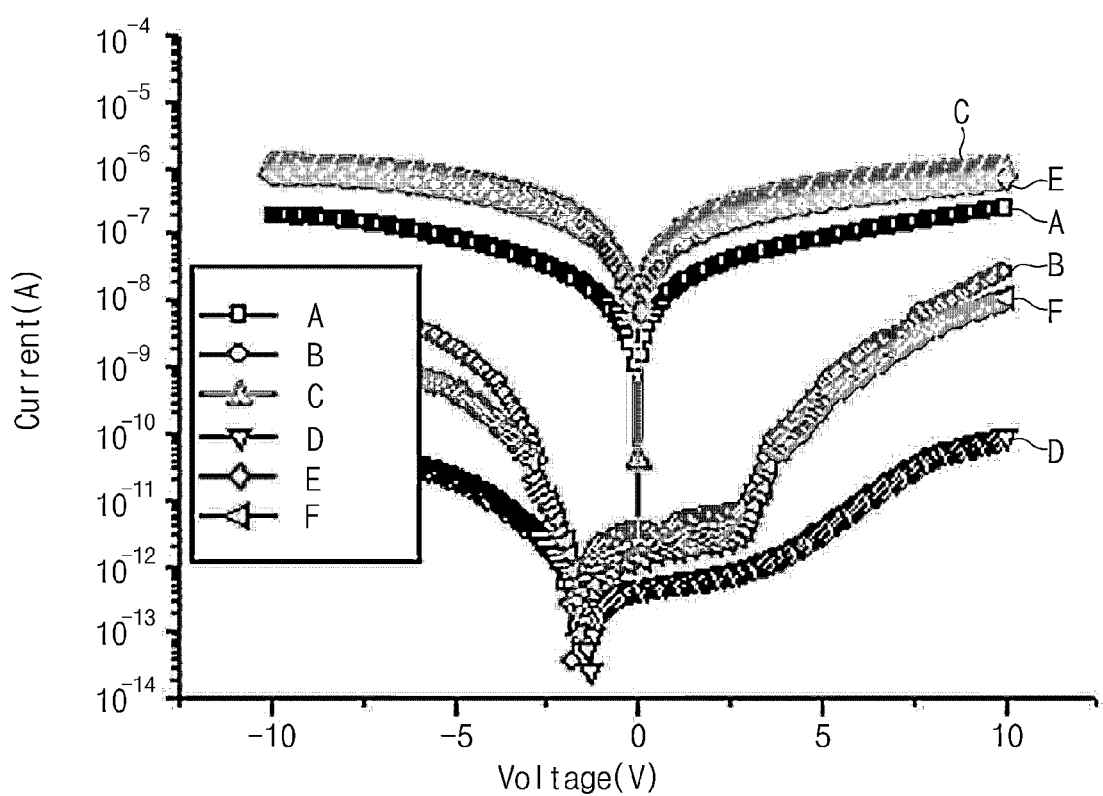
FIG. 7 is a graph illustrating the photocurrent characteristics of a nanocomposite photovoltaic device according to an exemplary embodiment of the present invention.

FIG. 7 is a graph illustrating the photocurrent characteristics of a nanocomposite photovoltaic device according to an exemplary embodiment of the present invention.

In the graph, a denotation A represents an on-current of a zinc oxide not including a silicon nanoparticle and a denotation B represents an off-current of a zinc oxide not including a silicon nanoparticle. A denotation C represents an on-current of a zinc oxide including a 5 wt % silicon nanoparticle, and a denotation D represents an off-current of a zinc oxide including a 5 wt % silicon nanoparticle. A denotation E represents an on-current of a zinc oxide including a 10 wt % silicon nanoparticle, and a denotation F represents an off-current of a zinc oxide including a 10 wt % silicon nanoparticle.

Referring to FIG. 7, it can be seen that the photocurrent of the zinc oxide (nanocomposite thin film) including the 5 wt % or 10 wt % silicon nanoparticle is larger. In particular, it can be seen that, if the 5 wt % silicon nanoparticle is included, the photocurrent characteristics are improved by about 10 times in the on-current and are improved by about 100 times in the off-current.

As described above, the embodiments of the present invention make it possible to easily form a nanocomposite solution mixed nanorods and nanoparticles. A nanocomposite thin film can be formed using the nanocomposite solution. The nanocomposite solution can make a large-area process possible. Also, the nanocomposite solution can be used in the field of a glass or plastic substrate requiring a low-temperature process. The electrical characteristics of the nanocomposite thin film can be improved by the metal oxide nanorod, and the optical characteristics of the nanocomposite thin film can be improved by the nanorod.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a nanocomposite solution, comprising:
    i) preparing a metal oxide nanorod solution, wherein the preparing of the metal oxide nanorod solution comprises:
        preparing a metal oxide precursor solution,
        preparing an alcohol-based solution including a basic chemical species,
        mixing/reacting the metal oxide precursor solution and the alcohol-based, solution to form a metal oxide nanorod, and
        applying an ultrasonic wave or an electromagnetic wave after mixing the metal oxide precursor solution and the alcohol-based solution;
    ii) preparing a nanoparticle solution, wherein the preparing of the nanoparticle solution comprises:
        mechanically grinding a target material to form primary particles,
        etching the primary particles with an etchant to form an intermediate, solution including secondary particles,
        removing a supernatant from the intermediate solution through a centrifugation process to form a purification solution, and diluting the purification solution with a dispersive solvent; and
    iii) mixing the metal oxide nanorod solution and the nanoparticle solution to form a nanocomposite solution.

2. The method of claim 1, wherein the metal oxide precursor solution comprises zinc acetate ($Zn(C_2H_3O_2)_2$).

3. The method of claim 1, wherein the alcohol-based solution is prepared by reacting potassium hydroxide (KOH) and methanol ($CH_3OH$).

4. The method of claim 1, wherein the metal oxide nanorod comprises a zinc oxide nanorod.

5. The method of claim 1, wherein the metal oxide nanorod comprises tin oxide ($SnO_2$), indium oxide ($In_2O_3$), or titanium oxide ($TiO_2$).

6. The method of claim 1, wherein the metal oxide nanorod has a length of about 50 nm to about 200 nm.

7. The method of claim 1, wherein the etchant comprises nitric acid, hydrofluoric acid, and water.

8. The method of claim 7, wherein the nitric acid, the fluoric acid and the water have a mass ratio of 50:5:50.

9. The method of claim 1, wherein the dispersive solvent comprises isopropyl alcohol (IPA) or methanol.

10. The method of claim 1, wherein the target material comprises silicon.

11. The method of claim 1, wherein the target material comprises aurum, argentum, gallium arsenide, indium arsenide, cadmium selenide, or zinc selenide.

* * * * *